United States Patent
Costa et al.

(10) Patent No.: US 7,142,069 B2
(45) Date of Patent: Nov. 28, 2006

(54) METHOD AND CIRCUIT ARRANGEMENT FOR AMPLITUDE REGULATION OF AN OSCILLATOR SIGNAL

(75) Inventors: Vincenzo Costa, Assling (DE); Henrik Icking, München (DE)

(73) Assignee: Infineon Technologies AG, Munich (DE)

( * ) Notice: Subject to any disclaimer, the term of this patent is extended or adjusted under 35 U.S.C. 154(b) by 55 days.

(21) Appl. No.: 10/976,447

(22) Filed: Oct. 29, 2004

(65) Prior Publication Data

US 2005/0225386 A1 Oct. 13, 2005

(30) Foreign Application Priority Data

Oct. 30, 2003 (DE) ................... 130 50 597

(51) Int. Cl.
*H03L 5/00* (2006.01)
*H03K 3/26* (2006.01)
*H03B 1/00* (2006.01)
*H03K 3/02* (2006.01)
*H03L 1/00* (2006.01)

(52) U.S. Cl. ............... 331/182; 331/111; 331/143; 331/176; 331/183; 331/74

(58) Field of Classification Search ......... 330/137; 331/182, 36 C, 18, 74, 109
See application file for complete search history.

(56) References Cited

U.S. PATENT DOCUMENTS

| | | | |
|---|---|---|---|
| 5,497,127 A * | 3/1996 | Sauer | 331/17 |
| 6,060,957 A * | 5/2000 | Kodrnja et al. | 331/143 |
| 6,570,443 B1 | 5/2003 | Casagrande | 330/129 |

FOREIGN PATENT DOCUMENTS

DE 102 09 044 A1 3/2002
WO WO 03/075450 A2 2/2003

\* cited by examiner

*Primary Examiner*—Benny Lee
*Assistant Examiner*—Alan Wong
(74) *Attorney, Agent, or Firm*—Brinks Hofer Gilson & Lione

(57) ABSTRACT

A circuit arrangement for controlling an amplitude of an oscillator signal is accomplished by comparing the oscillator signal to reference signals. The amplitude of the oscillator signal is capable of being adjusted by means of a control signal. The control signal is developed by a regulating circuit that depends upon a comparison result of the oscillator signal with a reference signal such that the amplitude of the oscillator signal adopts a desired value. At least one further reference signal is compared to the oscillator signal and the regulating circuit is adjusted depending on the comparison.

19 Claims, 2 Drawing Sheets

METHOD AND CIRCUIT ARRANGEMENT FOR AMPLITUDE REGULATION OF AN OSCILLATOR SIGNAL

RELATED APPLICATIONS

The present patent application claims priority under 35 U.S.C. § 119 (a)–(d) to German Patent Application 103 50 597.0, filed in Germany on Oct. 30, 2003, which is hereby incorporated by reference.

BACKGROUND

1. Technical Field

The present invention relates to controlling oscillator signals. In particular, the invention relates to oscillator signals for a wide range of frequencies.

2. Background Information

For microprocessor applications, oscillator circuits are required for providing a time-standard or clock pulse signal. The oscillator circuits fulfill requirements for limiting the power consumption of microprocessors by reducing the frequency during low processor demand, for reducing phase fluctuations between the triggering signals and the clock pulse signal, and minimizing harmonic distortions of the oscillator signal. In each case, amplitude regulation of the oscillator signal is provided.

For example, U.S. Pat. No. 6,570,443 discloses a circuit arrangement for regulating the amplitude of an oscillator signal by comparing the oscillator signal with a reference signal and controlling the amplitude of the oscillator signal with a control signal. The control signal serves to adjust and set an amplitude of the oscillator signal generated by an oscillator circuit.

The problem with conventional amplitude regulation is that the characteristic properties for a regulating circuit are fixed and can only be optimized for a specific oscillator circuit and a specific frequency range. This presents a problem if the oscillator circuit is replaced with an external or internal replacement circuit to provide a different operating frequency.

SUMMARY

This application provides a method and circuit arrangement that provides amplitude control for a wide range of frequencies in an oscillator circuit. The amplitude of an oscillator signal is capable of being adjusted by a control signal. The control signal is developed by a regulating circuit that depends upon a comparison of the oscillator signal with a reference signal such that the amplitude of the oscillator signal adopts a desired value. At least one further reference signal is compared to the oscillator signal and the regulating circuit is adjusted depending on the comparison.

In order to develop a control signal to control an amplitude of an oscillator signal, the oscillator signal is compared with a reference signal. The reference signal is a substantially constant signal. The value of the reference signal changes only on a time scale that is greater than a time period of the oscillator signal. Depending on the comparison between the oscillator signal and the reference signal, the control signal is developed by a regulating circuit in such a way that the amplitude of the oscillator signal is controlled to a desired value. The desired value of the amplitude is a function of the reference signal. The regulating circuit is a parallel combination of a resistive element and a capacitor. The control signal is based upon the charge of the capacitor and will eventually determine the value of the amplitude of the oscillator signal.

The control signal is generated by a charge or discharge current to the capacitor. The current depends upon the comparison of the oscillator signal with the reference signal and is controlled by a switch. As a result, the charge on the capacitor is increased or decreased depending on the comparison, with which a correspondingly changing voltage signal is linked. The voltage signal derives the control signal for the oscillator circuit. It may be advantageous in this situation for the adjustment of the regulating circuit to be adjusted to the charge current.

The regulating circuit may be adjusted to provide a faster response. The adjustment of the regulating circuit may be performed on the resistive element. Since the resistive element forms a parallel circuit with a capacitor, the adjustment will also adjust the time constant of the regulating circuit. Thus when the resistance of the resistive element is varied, the time constant of the parallel circuit is varied because the capacitor may discharge through the resistive element. This adjustment may provide a shorter time period for regulating the amplitude of the oscillator signal while at the same time provide a high stability to the regulating circuit.

In an embodiment, a method for controlling the amplitude of the oscillator circuit may be characterized by the comparison of the oscillator signal with at least one further substantially constant reference signal. The regulating circuit may be adjusted depending on the comparison of the oscillator signal with the at least one further reference signal.

In another embodiment, a circuit arrangement may include comparators for the comparison of the oscillator signal with the reference signal and the at least one further reference signal, a regulating circuit for regulating the control signal, and adjustment means for adjusting the regulating circuit. The components of the circuit arrangement can substantially be realized by the means of transistor circuits. In addition, the circuit arrangement may include an oscillator circuit.

The method and apparatus in accordance with the invention may provide a self-adjusting amplitude regulation for a large frequency range and for different oscillator circuits where the oscillator circuits have varying quality or frequency.

Further advantages of the invention can be derived from the following detailed description. Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE DRAWINGS AND THE PRESENTLY PREFERRED EMBODIMENTS

Figure 1:
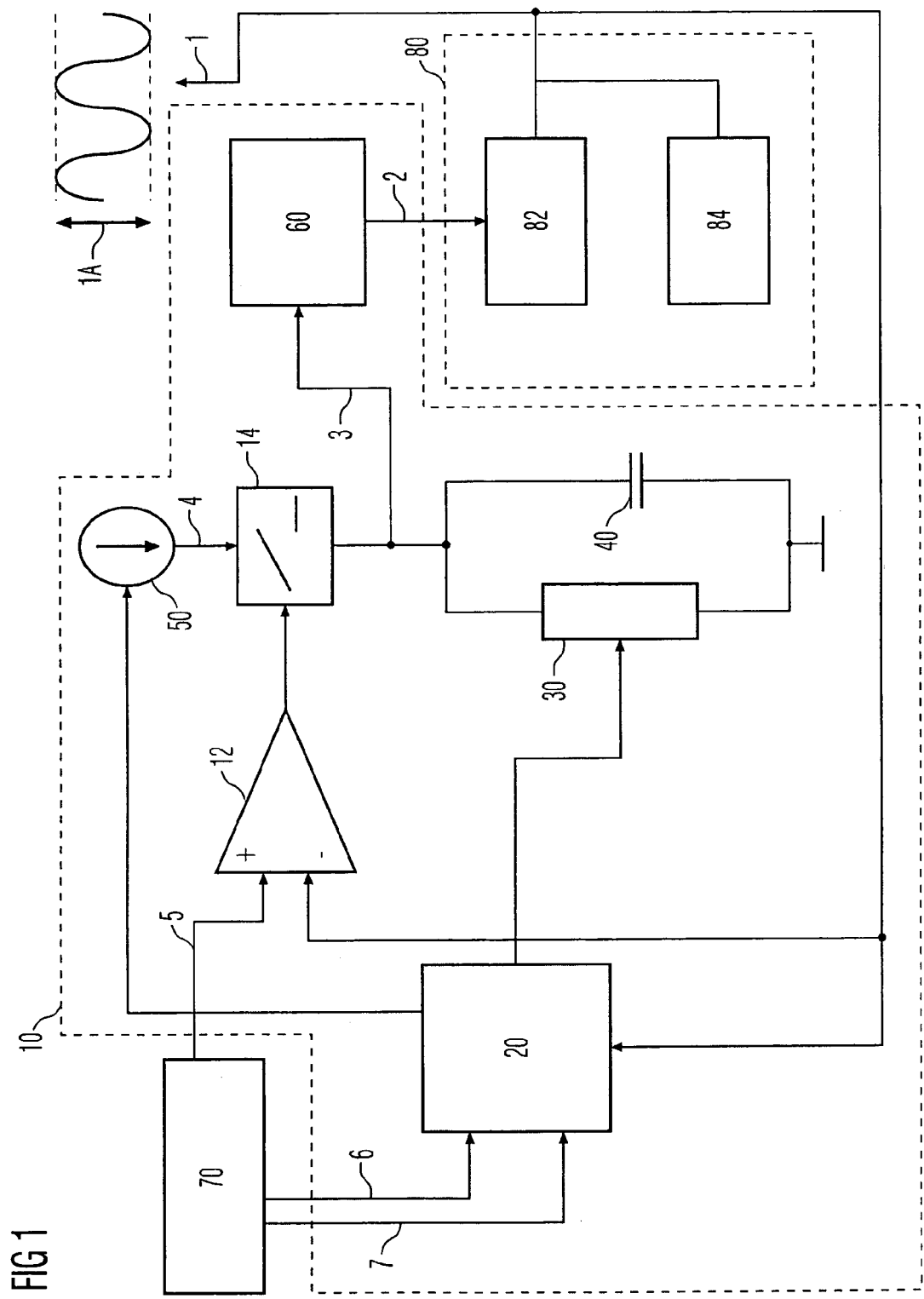
FIG. 1 is a block diagram of a circuit arrangement for regulating an oscillator signal amplitude.

A block diagram of a circuit arrangement for regulating an amplitude of an oscillator signal is shown in FIG. 1. In the circuit arrangement, an oscillator circuit 80 provides an oscillation signal 1 and is connected to an amplitude regulating circuit 80. The amplitude regulating circuit 10 controls the oscillator circuit 80 with a control signal 2. The amplitude regulating circuit 80 is connected to a reference signal source 70 and receives reference signals 5, 6, 7 from the reference signal source 70.

The oscillator circuit 80 has an amplification stage 82 and a feedback network 84. The oscillator circuit 80 generates an oscillator signal 1. The frequency of the oscillator circuit is determined by the components within the feedback network 84. The amplitude of the oscillator signal 1 is determined by a control signal in the form of a control-current signal 2, which is fed to the amplification stage 82 from a current control circuit 60.

A reference signal source 70 provides reference signals 5, 6, 7. The reference signal source may include band gap elements for determining the reference signals 5, 6, 7. The reference voltage signals 5, 6, 7 are substantially time-constant signals and may be developed from crystals. Any change in the reference voltage signals is negligible during a time period of the oscillator signal 1.

An amplitude regulating circuit 10 has a comparison means in the form of a comparator 12 that compares the oscillator signal 1 and the reference-voltage signal 5 from the reference signal source 70. A switch 14 is controlled by an output signal from the comparator 12. Depending on the output signal of the comparator 12, the switch 14 may connect a parallel circuit that includes a resistive element 30 and a capacitor 40 to a charge current source 50. The charge current source 50 provides a charge current 4 to the parallel circuit. The parallel combination of the resistive element 30 and the capacitor 40 form a regulating circuit. The resistive element 30 may be a grouping of components to form a resistance or variable resistance. A voltage signal 3 is developed between the switch 14 and the parallel combination of the resistor 30 and the capacitor 40 and is an input signal to the current control circuit 60. A comparison circuit 20 is another element in the amplitude regulating circuit 10 and is connected to the reference signal source 70 via reference signals 6, 7. The output of the comparison circuit 20 is used to control the resistive element 30 in the regulating circuit.

Control of the oscillation signal amplitude begins with a comparison of an oscillation signal 1 and a reference voltage signal 5. When the value of the oscillator signal 1 is less than the reference voltage signal 5, a switch 14 will close. With the switch 14 closed, a capacitor 40 will be charged by a charging current 4 from a current source 50. When the oscillator signal 1 is greater than the reference voltage signal 5, the switch 14 is opened. The capacitor 40 will then discharge through a resistive element 30. Again, the capacitor 40 and the resistive element 30 form a regulating circuit that has a time constant based on the capacitor 40 and the resistive element 30. The time constant may be varied and preferably is varied by adjusting the resistance of the resistive element 30. This process will be discussed below.

A voltage signal 3 is developed between the switch 14 and the parallel circuit combination of the resistive element 30 and the capacitor 40. The regulating circuit, formed by the resistive element 30 and the capacitor 40, may increase or decrease by charging and discharging the capacitor. The voltage signal 3 operatively connects to a current control block 60 that generates the control-current signal 2 in response to the input voltage signal 3. The control-current signal 2 controls the amplification stage 82 of the oscillator circuit 80.

The output of a comparison circuit 20 is used for adjusting the regulating circuit that includes the resistive element 30 and the capacitor 40. The comparison circuit uses two reference voltage signals 6, 7 from the reference signal source 70 and compares the reference voltage signals 6, 7 with the amplitude 1A of the oscillator signal 1. The output of the comparison circuit 20 controls and adjusts the resistive element 30.

For example, when the charging current is increased, an accelerated charging of the capacitor 40 takes place. The rapid increase in the voltage level of the voltage signal 3 causes the control current signal 2 from the current control circuit 60 to rapidly increase the amplitude 1A of the oscillator signal 1.

In another embodiment, a comparison circuit 20 may adjust the resistive element of the regulating circuit. The comparison circuit 20 performs the adjustment based upon a comparison of the oscillator signal with the reference signals 6, 7. A reduction in the resistance of the resistance element 30, allows the capacitor 40 to discharge faster. The voltage signal 3 drops quickly and the voltage signal is acted upon by the current control circuit 60 affecting the control current signal 2. The control current signal 2 will control the amplification stage 82 and reduce the amplitude 1A of the oscillator signal 1.

There are at least two parameters provided for the independent adjustment of the properties of the regulating circuit that includes the parallel combination of the capacitor 40 and the resistive element 30. The reference voltage signals 6, 7, are selected in such a way that they define a tolerance band around a desired amplitude. The desired amplitude is defined by a reference voltage signal 5. By appropriately selecting the reference voltage signals 6, 7, an improvement in the transient response of the circuit arrangement may be achieved.

Figure 2:
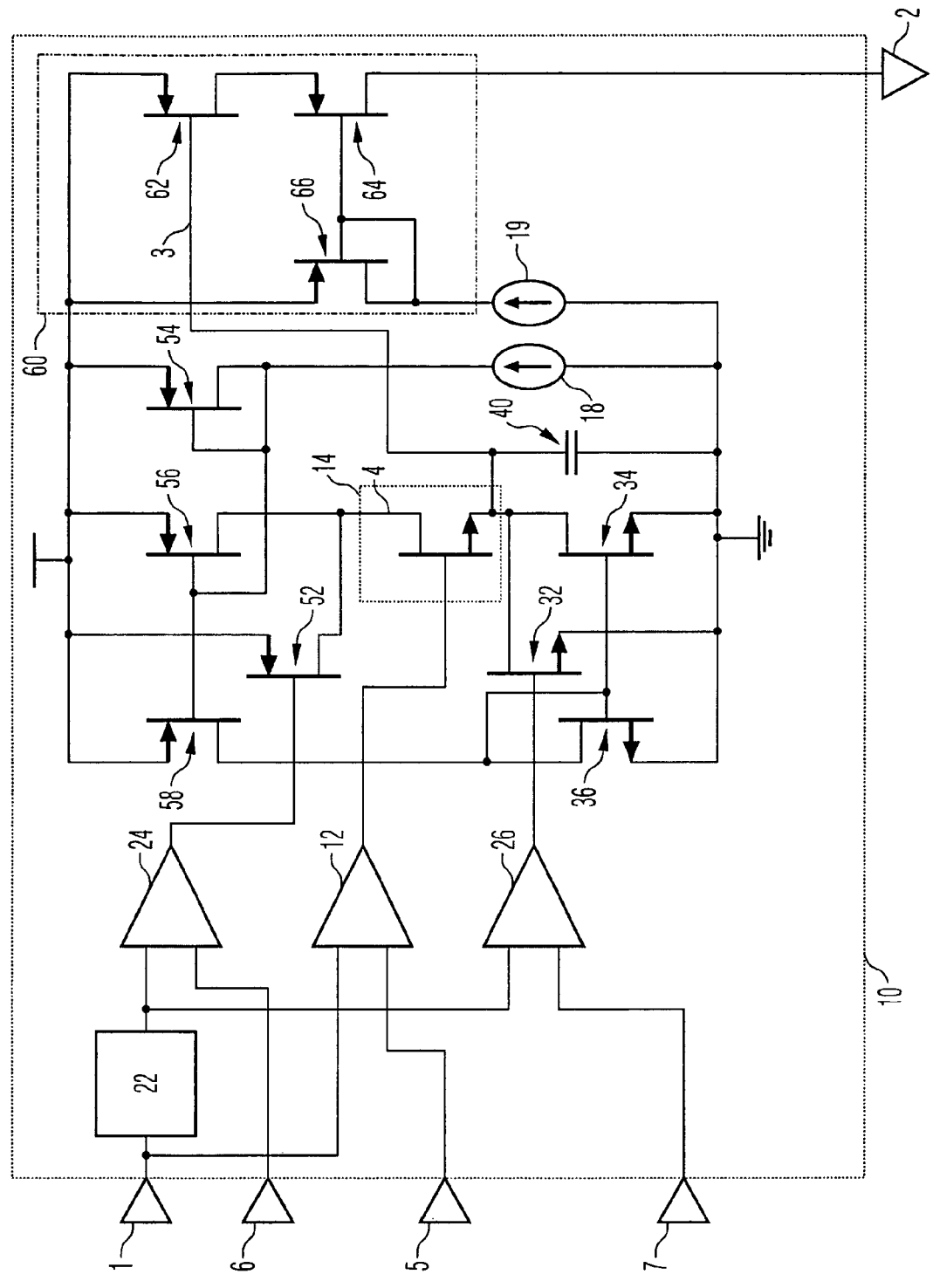
FIG. 2 is a schematic of an amplitude control circuit for an oscillator circuit.

A circuit representation of the amplitude regulating circuit 10 is shown in FIG. 2. The comparison block 20 is represented by two comparators 24, 26. One comparator 24 is associated with a reference signal 6 while the other comparator 26 is associated with the other reference signal 7. The comparison block 20 also has a peak detector 22, to which the oscillator signal 1 is operatively connected. Comparator 12, as in FIG. 1, receives the reference voltage signal 5 from the comparison circuit 22 and the oscillator signal 1. The resulting signal of the comparison is directed to switch 14 that may be a transistor 14. The transistor 14 is connected to a capacitor 40 and transistors 32, 34, 36 which may form the resistive element 30 of FIG. 1. Transistors 52, 54, 56, 58 may form the charge current source 50 of FIG. 1 and if the transistor sizing is appropriate, the transistors 52, 54, 56, 58 may provide part of the resistance element 30. The voltage signal 3 at the drain of transistor 14 is applied to the gate of transistor 62. The combination of transistors 62, 64, 66 form the current control circuit 60 of FIG. 1. The control-current signal 2 is developed at the drain of transistor 64 and is fed to the oscillator amplification stage 82.

The peak detector 22 determines the signal peaks of the oscillator signal. The output signal of the peak detector 22 represents a value for the amplitude 1A of the oscillator signal 1. The output signal of the peak detector 22 is compared with the reference voltage signal 6, 7 in the comparators 24, 26 respectively. The comparator 12, as already explained in connection with FIG. 1, compares the oscillator signal 1 directly with the reference voltage signal 5 and the result of the comparison is applied to the switch 14.

The switch 14 of FIG. 1 is realized in the form of a transistor 14. The resistive element 30 is formed by transistors 32, 34, 36 and the charge current source 50 is formed by transistors 52, 54, 56, 58. A first bias-current source 18 serves to provide a first bias current. The resistive element 30 is implemented in particular by the output resistance of the transistor 34, and may depend upon the first bias current from the first bias circuit source 18 and the physical dimensions of the transistors 56, 58, 34, 36. The resistive element 30 may be varied by the voltage signal applied to a gate on a transistor 32 from comparator 26. The value of the charge current 4 may be adjusted by means of a gate voltage of the transistor 52 from a comparator 24. The charge current 4 is influenced by the gate voltage of the transistors 56, 58, which in turn is adjusted by the first bias current of the first bias current source 18 and the transistor 54.

The current-control circuit 60 generates the control current 2 as a function of the voltage signal 3. The current control circuit 60, comprises transistors 62, 64, 66, and is fed with a second bias current by a second bias-current source 19. As a result of the independent generation of the second bias current, the control-current signal 2 may be scaled by the control signal from the regulating circuit.

In FIG. 2, the comparison block 20 is designed digitally. In other words, the comparators 12, 24, 26 generate an output signal which is one of two possible signals. The control of the regulating circuit is affected by switching between two states. However, it may be possible for the comparison block 20 to operate in an analog mode. In the analog mode, a continuous adjustment of the resistor and/or charge current 4 is effected in the regulating circuit. As a result, a further optimization of amplitude regulation may be achieved.

In an embodiment of the circuit arrangement, a reference signal source 70 may be provided in the circuit arrangement. The reference signal source generates the reference voltage signal and the at least one further reference voltage signal. The reference signal source may comprise a band gap element, which provides a reference voltage signal largely independent of external influences, such as the temperature.

In another embodiment, the circuit arrangement may include an oscillator circuit. This enables a compact circuit arrangement to be created on one chip. In particular, the circuit arrangement also may comprise several oscillator circuits, where one oscillator circuit is selectively controlled for regulating the amplitude of the oscillator signal. The oscillator signal may be connected to a comparison means or comparator for feed-back control. In this circuit arrangement, an oscillator signal with a selectable frequency and regulated amplitude is provided.

In another embodiment, a method for controlling an amplitude of an oscillator signal may be provided. The amplitude of the oscillator signal can be adjusted by a control signal that is varied in response to a comparison of the oscillator signal with a reference signal. The reference voltage signal is a substantially constant signal. For instance, the value of the reference voltage signal may change on time scales that are greater than a period duration of the oscillator signal. Depending on the comparison between the oscillator signal and the reference voltage signal, the control signal may be controlled by means of a regulating circuit. The regulating circuit may include a resistance element, as defined previously, and a capacitor. The amplitude of the oscillator signal is regulated at a desired value that depends on the reference voltage signal. The regulating circuit may provide a control signal by adjusting the amount of charging current that is flowing to and from the capacitor. In particular, this adjustment will depend upon the comparison of the amplitude of the oscillator signal with the reference signal.

The method also may compare the oscillator signal with at least one further substantially constant reference voltage signal. The regulating circuit is adjusted in response to the comparison of the oscillator signal with the at least one further reference signal. This adjustment may include varying the resistance value of the resistive element for controlling the discharge time of the capacitor. The adjustment may include varying the charging current in the current source. By adjusting the resistance of the resistance element, the time constant of the regulating circuit will be adjusted. By providing at least two methods of amplitude control for the oscillation signal, one for varying the control signal from the regulating circuit for controlling the oscillation signal amplitude, the other for adjusting the regulating circuit, the stability of the regulating circuit is increased and the time for adjusting and regulating the amplitude is shortened with respect to the properties of the oscillator circuit or external influences. This method may be realized with appropriate transistor circuits.

It is therefore intended that the foregoing detailed description be regarded as illustrative rather than limiting, and that it be understood that it is the following claims, including all equivalents, that are intended to define the spirit and scope of this invention.

The invention claimed is:

1. A circuit arrangement for controlling an amplitude of an oscillator signal, comprising:
    a first comparing circuit for comparing the oscillator signal with a reference voltage signal;
    a regulating circuit connected to an output of the comparator, the regulating circuit providing a first control signal and the regulating circuit having an adjustable time constant;
    an amplitude control circuit receiving the control signal and controlling the oscillator signal amplitude based on the control signal; and
    a second comparing circuit for comparing the oscillator signal with at least one further reference voltage signal and providing a second control signal for adjusting the time constant of the regulating circuit.

2. The circuit arrangement according to claim 1, further comprising a reference signal source for providing the reference voltage signal.

3. The circuit arrangement according to claim 2, further comprising a band gap element in the reference signal source.

4. The circuit arrangement according to claim 1, further comprising at least one oscillator circuit for the generation of the oscillator signal.

5. The circuit arrangement according to claim 1, further comprising a plurality of oscillator circuits where the amplitude of the oscillator signal is selectively controlled at one of the plurality of oscillator circuits.

6. The circuit arrangement according to claim 1, where the regulating circuit further comprises a resistive element and a capacitor.

7. The circuit arrangement according to claim 6, where the resistive element comprises a resistor.

8. The circuit element according to claim 6, where the resistive element comprises a plurality of transistors.

9. The circuit element according to claim 8, where the plurality of transistors are sized to provide a varying resistive value.

10. A method for regulating the amplitude of an oscillator signal, the method comprising:
    comparing the oscillator signal with a substantially constant reference voltage signal;
    controlling a regulating circuit in response to the comparison between the oscillator signal and the reference voltage signal;
    regulating the amplitude of the oscillator signal with a control signal from the regulating circuit;
    comparing the oscillator signal with at least one further reference voltage signal; and
    adjusting the time constant of the regulating circuit in response to the comparison of the oscillator signal with the at least one further reference voltage signal.

11. The method according to claim 10, where the time constant of the regulating circuit is determined by a capacitor and a resistive element.

12. The method according to claim 11, further comprising adjusting a resistance of the resistive element.

13. The method according to claim 10, where the control signal is determined by a charge on a capacitor in the regulating circuit.

14. The method according to claim 13, where the charge on the capacitor is charged or discharged with a charging current.

15. The method according to claim 14, where adjusting of the time constant is effected by adjusting the charging current.

16. The method according to claim 10, where comparing the oscillator signal with the reference voltage signal and/or the at least one further reference voltage signal comprises comparing the amplitude of the oscillator signal to the reference voltage signal and/or the at least one further reference voltage signal.

17. The method according to claim 10, further comprising adjusting the time constant by digitally switching between specified states.

18. The method according to claim 10, further comprising adjusting the regulating circuit with a continuous signal for analog control.

19. A circuit arrangement for controlling an amplitude of an oscillator signal, comprising:
    a reference signal source for providing reference voltage signals;
    a first comparison circuit for comparing the reference voltage signals against the oscillator signal and providing a signal to a regulating circuit where the regulating circuit has an adjustable time constant and provides a first control signal;
    an oscillator circuit that provides the oscillator signal and the amplitude of the oscillator signal is determined by the first control current; and
    a second comparison circuit for comparing the amplitude of the oscillator signal to at least one further reference voltage signal, wherein the second comparison circuit provides a second control signal for adjusting the time constant of the regulating circuit in response to the comparison of the oscillator signal and the further reference voltage signal, wherein the regulating circuit includes a resistive element and a capacitor for determining the time constant and the voltage on the capacitor determined the first control signal.

* * * * *

UNITED STATES PATENT AND TRADEMARK OFFICE
CERTIFICATE OF CORRECTION

| | |
|---|---|
| PATENT NO. | : 7,142,069 B2 |
| APPLICATION NO. | : 10/976447 |
| DATED | : November 28, 2006 |
| INVENTOR(S) | : Vincenzo Costa et al. |

It is certified that error appears in the above-identified patent and that said Letters Patent is hereby corrected as shown below:

On the Title Page

Item (75), inventor address delete "Assling" and substitute --Munchen-- in its place.

Signed and Sealed this

Twenty-seventh Day of March, 2007

JON W. DUDAS
*Director of the United States Patent and Trademark Office*